(12) United States Patent
Hsu et al.

(10) Patent No.: US 9,437,578 B2
(45) Date of Patent: Sep. 6, 2016

(54) STACKED IC CONTROL THROUGH THE USE OF HOMOGENOUS REGION

(71) Applicant: Taiwan Semiconductor Manufacturing Company, Ltd., Hsin-Chu (TW)

(72) Inventors: Wen-I Hsu, Tainan (TW); Cheng-Ying Ho, Minxiong Township (TW); Jeng-Shyan Lin, Tainan (TW); Feng-Chi Hung, Chu-Bei (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/316,125

(22) Filed: Jun. 26, 2014

(65) Prior Publication Data

US 2015/0380385 A1 Dec. 31, 2015

(51) Int. Cl.
*H01L 25/065* (2006.01)
*H01L 23/48* (2006.01)
*H01L 21/306* (2006.01)
*H01L 27/146* (2006.01)
*H01L 25/00* (2006.01)
*H01L 21/768* (2006.01)
*H01L 23/00* (2006.01)

(52) U.S. Cl.
CPC ..... *H01L 25/0657* (2013.01); *H01L 21/30604* (2013.01); *H01L 21/76802* (2013.01); *H01L 21/76898* (2013.01); *H01L 23/481* (2013.01); *H01L 24/03* (2013.01); *H01L 24/09* (2013.01); *H01L 25/50* (2013.01); *H01L 27/1469* (2013.01); *H01L 27/14632* (2013.01); *H01L 27/14634* (2013.01); *H01L 27/14636* (2013.01); *H01L 27/14687* (2013.01); *H01L 2224/08146* (2013.01); *H01L 2225/06541* (2013.01); *H01L 2225/06548* (2013.01); *H01L 2924/14* (2013.01)

(58) Field of Classification Search
CPC ........... H01L 23/147; H01L 23/49894; H01L 23/481; H01L 23/49827; H01L 23/53295; H01L 25/0657
USPC ........... 257/737, E21.545, E23.021; 438/107
See application file for complete search history.

(56) References Cited

U.S. PATENT DOCUMENTS

| 2004/0084761 | A1* | 5/2004 | Karthikeyan et al. | ........ 257/700 |
| 2008/0142990 | A1* | 6/2008 | Yu et al. | ........ 257/777 |
| 2010/0289084 | A1* | 11/2010 | Yoon et al. | ........ 257/368 |
| 2012/0126394 | A1* | 5/2012 | Huang | ........ 257/737 |
| 2014/0054789 | A1* | 2/2014 | Chiu et al. | ........ 257/774 |

* cited by examiner

*Primary Examiner* — Thomas L Dickey
*Assistant Examiner* — Changhyun Yi
(74) *Attorney, Agent, or Firm* — Slater Matsil, LLP

(57) ABSTRACT

A package includes a semiconductor chip. The semiconductor chip includes a substrate, a plurality of dielectric layers underlying the substrate, a dielectric region penetrating through the plurality of dielectric layers, and a metal pad overlapped by the dielectric region. A conductive plug penetrates through the substrate, the dielectric region, and the metal pad.

20 Claims, 13 Drawing Sheets

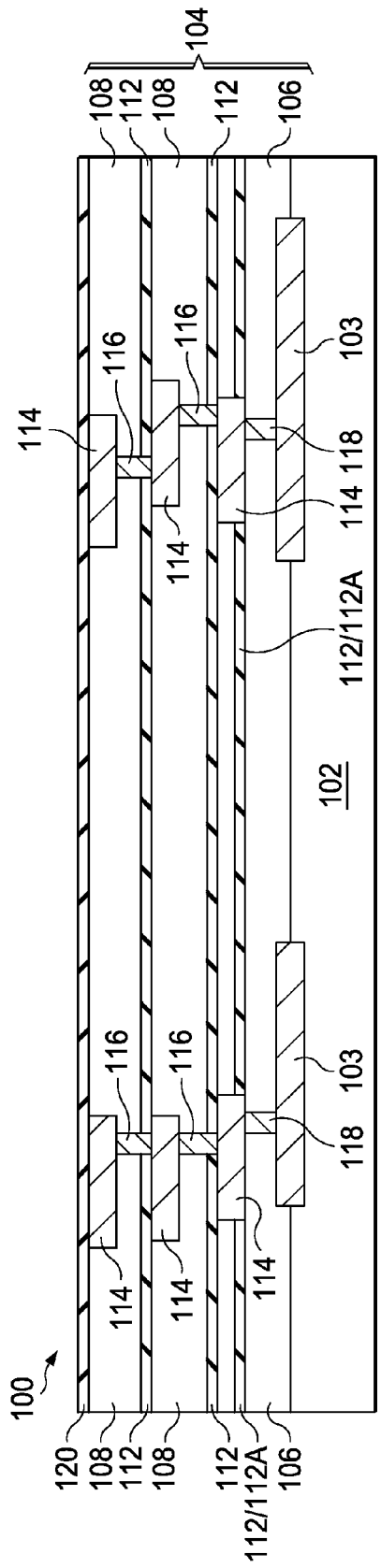
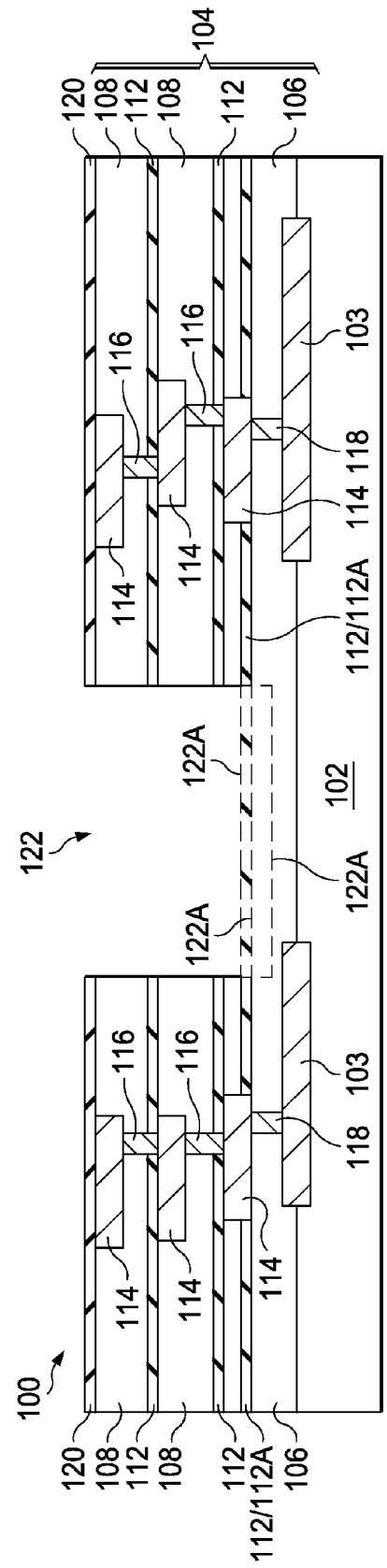
FIG. 1
FIG. 2

STACKED IC CONTROL THROUGH THE USE OF HOMOGENOUS REGION

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g. shrinking the semiconductor process node towards the sub-20 nm node), which allows more components to be integrated into a given area. As the demand for miniaturization, higher speed, and greater bandwidth, as well as lower power consumption and latency, has grown recently, the need for smaller and more creative packaging techniques of semiconductor dies has grown.

As semiconductor technologies further advance, stacked semiconductor devices have emerged as an effective alternative to further reduce the physical size of a semiconductor device. In a stacked semiconductor device, active circuits such as logic, memory, processor circuits, and the like are formed on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding, and/or the like. Once two semiconductor wafers are bonded together, the interface between two semiconductor wafers may provide an electrically conductive path between the stacked semiconductor wafers.

An advantageous feature of the stacked semiconductor devices is that much higher density can be achieved by employing stacked semiconductor devices. Furthermore, stacked semiconductor devices can achieve smaller form factors, cost-effectiveness, increased performance, and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 7 illustrate the cross-sectional views of intermediate stages in the formation of a wafer in accordance with some exemplary embodiments;

DETAILED DESCRIPTION

Figure 3:
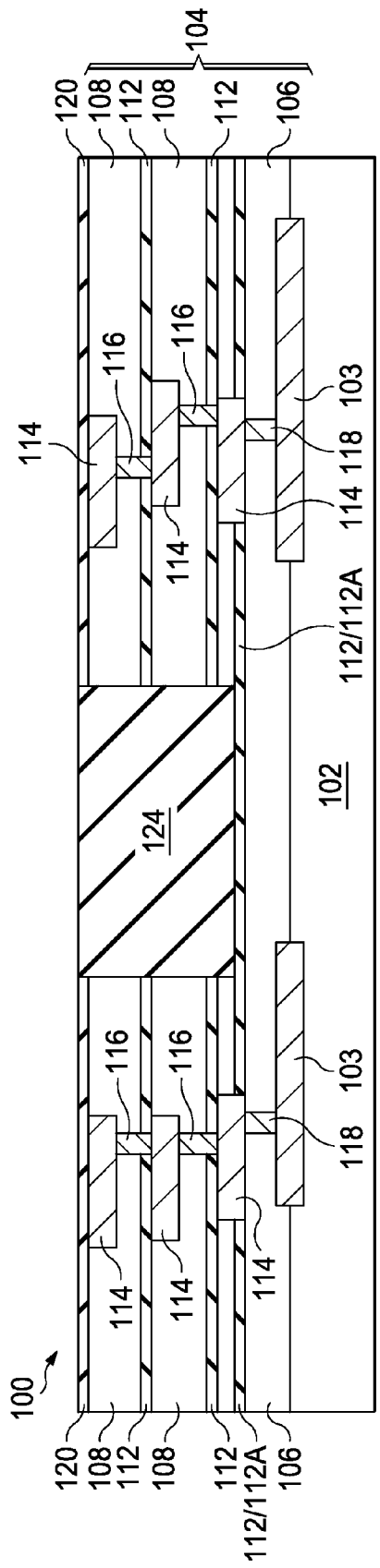

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit package including stacked dies/chips and an interconnect structure interconnecting the stacked chips as well as the method of forming the same structure are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 18:
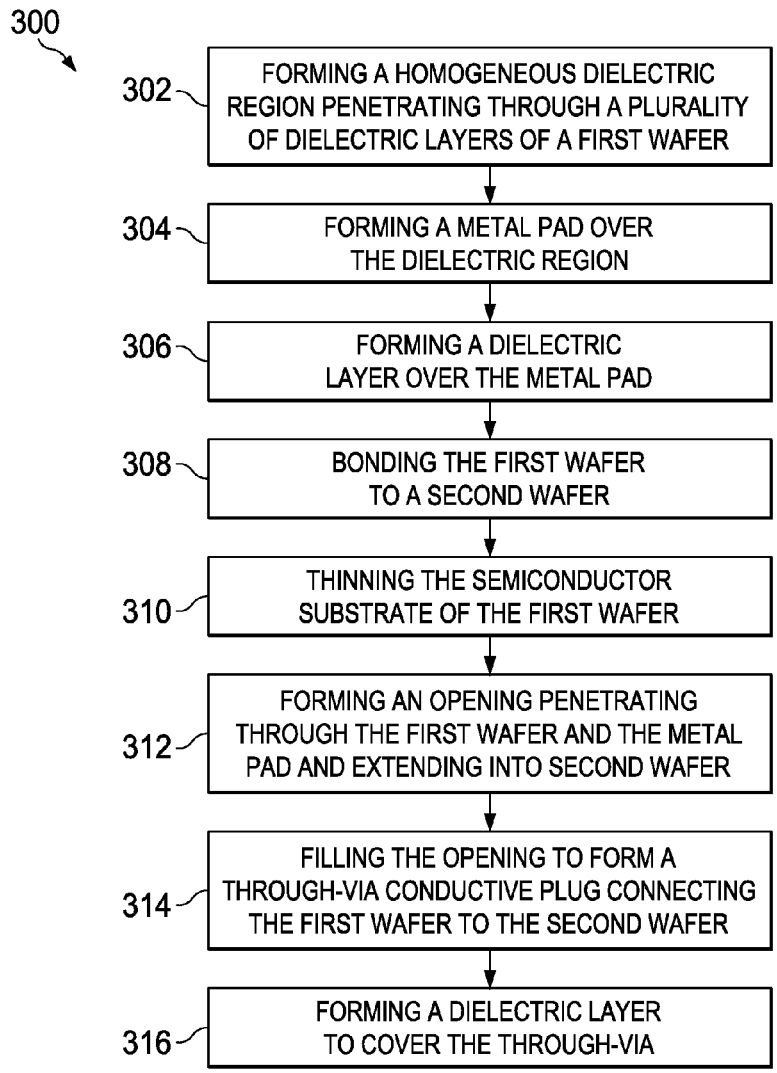
FIG. 18 illustrates a process flow in accordance with some embodiments.

FIGS. 1 through 15 illustrate the cross-sectional views of intermediate stages in the formation of a wafer, the bonding of two wafers, and the formation of a conductive plug connecting two wafers in accordance with some embodiments. The steps shown in FIGS. 1 through 15 are also illustrated schematically in the process flow 300 shown in FIG. 18. In the subsequent discussion, the process steps shown in FIGS. 1 through 15 are discussed referring to the process steps in FIG. 18.

FIGS. 1 through 7 illustrate the cross-sectional views of intermediate stages in the formation of semiconductor wafer 100. FIG. 1 illustrates a cross-sectional view of wafer 100 in accordance with some embodiments of the present disclosure. As shown in FIG. 1, semiconductor wafer 100 includes semiconductor substrate 102. Semiconductor substrate 102 may be formed of silicon, although it may also be formed of other group III, group IV, and/or group V elements such as silicon germanium, silicon carbon, a III-V compound semiconductor, or combinations thereof. In addition, other substrates that may be used include multi-layered substrates, gradient substrates, hybrid orientation substrates, or combinations thereof.

Wafer 100 may further include a variety of electrical circuits 103 formed on semiconductor substrate 102. Electrical circuits 103 may be any types of circuitry suitable for a particular application. In accordance with some embodiments, electrical circuits 103 include various N-type Metal-Oxide Semiconductor (NMOS) devices and/or P-type Metal-Oxide Semiconductor (PMOS) devices, capacitors, resistors, diodes, photo diodes, fuses, and/or the like. In accordance with some embodiments, wafer 100 is an image sensor wafer, and hence electrical circuits 103 include photo diodes, which are capable of converting light signals into electrical signals.

Interconnect structure 104 is formed over semiconductor substrate 102, and is electrically connected to, and interconnect the devices in, electrical circuits 103. Interconnect structure 104 may include Inter-Dielectric Layer (ILD) 106, Inter-Metal Dielectric (IMD) layers 108, metal lines 114, and vias 116. ILD 106 may include silicon oxide, phosphosilicate glass (PSG), borosilicate glass (BSG), boron-doped phosphosilicate glass (BPSG), fluorine-doped silicate glass (FSG), tetraethyl orthosilicate (TEOS) oxide, or the like. IMD layers 108 may be formed of low-k dielectric layers having a dielectric constants (k-values) lower than about 3.0, for example. IMD layers 108 may comprise black diamond (a registered trademark of Applied Materials), carbon-containing low-k dielectric materials, or the like. Etch stop layers 112 may also be formed between the plurality of ILD and IMD layers. For example, etch stop layers 112 may comprise silicon carbide, silicon nitride, silicon carbo-nitride, silicon oxynitride, or the like. Metal lines 114 are formed in IMD layers 108. The metal lines 114 in different layers of metal lines are interconnected by vias 116. Contact plugs 118 are formed in ILD 106, and may electrically connect electrical circuits 103 to the overlying metal lines 114 and vias 116.

Dielectric layer 120 is formed over the metal lines 114 in the top layer of IMD layers 108. In accordance with some embodiments, dielectric layer 120 comprises silicon carbide, silicon nitride, silicon carbo-nitride, silicon oxynitride, or multi-layers thereof.

FIGS. 2 and 3 illustrate the formation of a homogeneous dielectric region. The respective step is shown as step 302 in the process flow shown in FIG. 18. Referring to FIG. 2, an etching step is performed to etch dielectric layer 120, IMD layers 108, and etch stop layers 112. The etching may be performed after all low-k dielectric layers have been formed, which means that the subsequently formed dielectric layers over dielectric layer 120 may all be non-low-k dielectric layers. Opening 122 is thus formed. In accordance with some embodiments of the present disclosure, opening 122 penetrates through all of IMDs 108, and stops on a dielectric layer that is over semiconductor substrate 102. Accordingly, semiconductor substrate 102 is separated from opening 122 by at least one dielectric layer. For example, opening 122 may stop on the top surface of etch stop layer 112A, which is over and in contact with ILD 106. In alternative embodiments, opening 122 penetrates through etch stop layer 112A, and stops on ILD 106. In yet alternative embodiments, the bottom of opening 122 is at a level lower than the top surface of ILD 106. For example, opening 122 may stop on a top surface of a contact etch stop layer (Not shown). Dashed lines 122A schematically illustrate the various candidate positions of opening 122. The etching is performed using a dry etching in some embodiments, which may be anisotropic.

Next, opening 122 is filled with a dielectric material to form dielectric region 124, as shown in FIG. 3. In accordance with some embodiments, dielectric region 124 is a homogenous dielectric region formed of a homogenous material. Alternatively stated, the entire dielectric region 124 may be formed of the same dielectric material. In accordance with some embodiments of the present disclosure, dielectric region 124 comprises an oxide such as silicon oxide, a nitride such as silicon nitride, a carbide such as silicon carbide, a carbo-nitride such as silicon carbo-nitride, or an oxynitride such as silicon oxynitride. Other dielectric materials may also be used. The formation may include a Chemical Vapor Deposition (CVD) method such as Low Pressure Chemical Vapor Deposition (LPCVD), Plasma Enhanced Chemical Vapor Deposition (PECVD), High Density Plasma Chemical Vapor Deposition (HDP CVD), Atomic Layer Deposition (ALD), spin on, Flowable Chemical Vapor Deposition (FCVD), or any other applicable method. After the deposition of the dielectric material, a planarization such as Chemical Mechanical Polish (CMP) is performed to remove the excess portions of the dielectric material over dielectric layer 120. The remaining portion of the dielectric material is thus dielectric region 124. In the CMP, dielectric layer 120 may be used as a CMP stop layer. Hence, dielectric region 124 and dielectric layer 120 may be formed of different dielectric materials, although they may be chosen from the same group of candidate materials in some embodiments.

Figure 4:
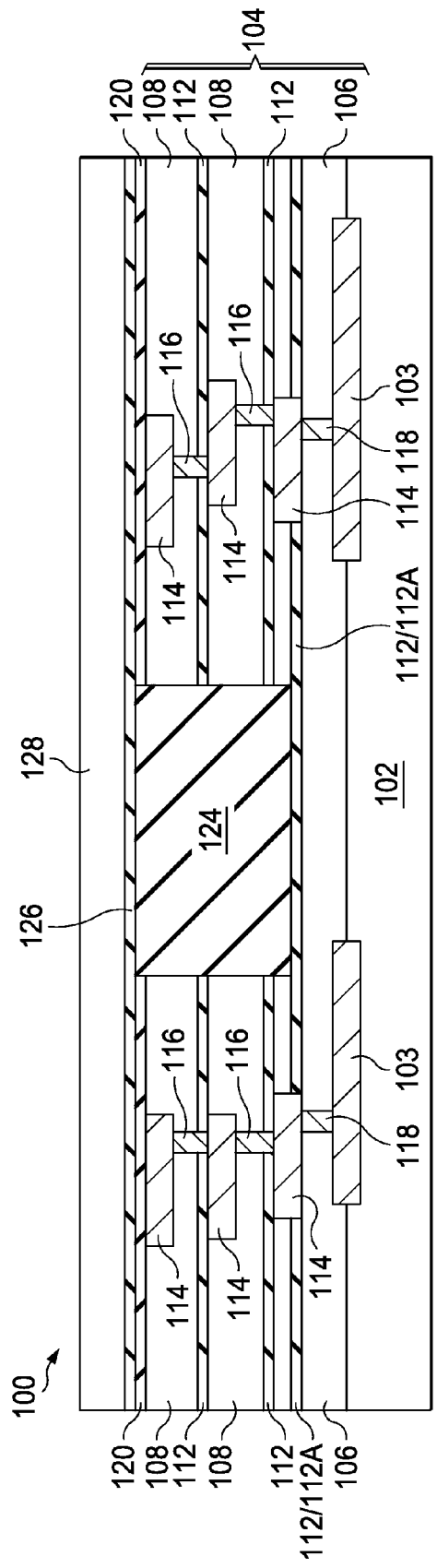
Figure 5:
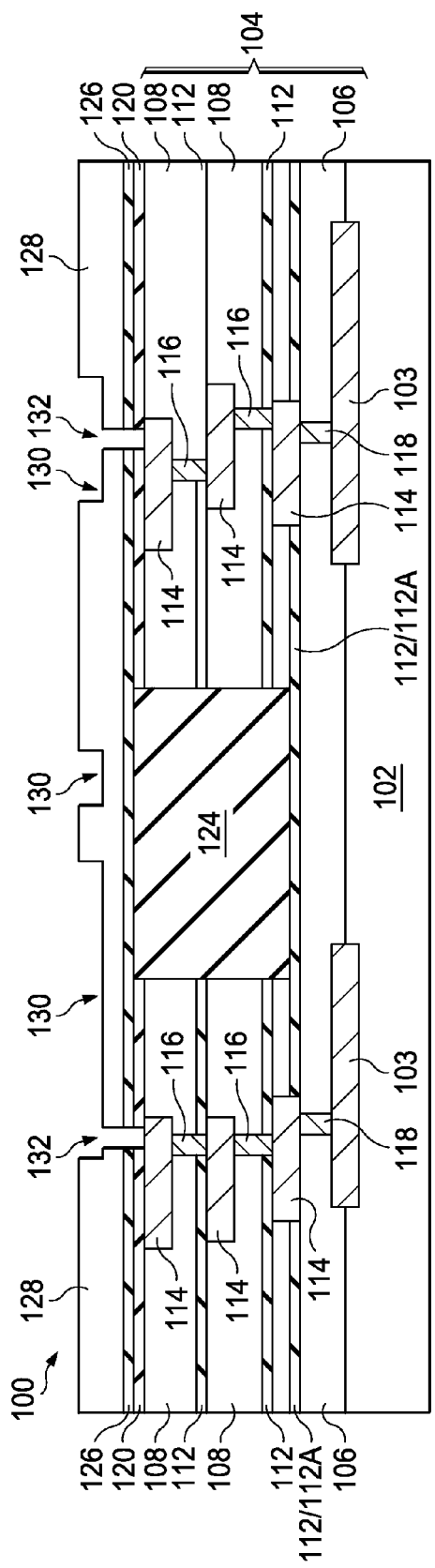
Figure 6:
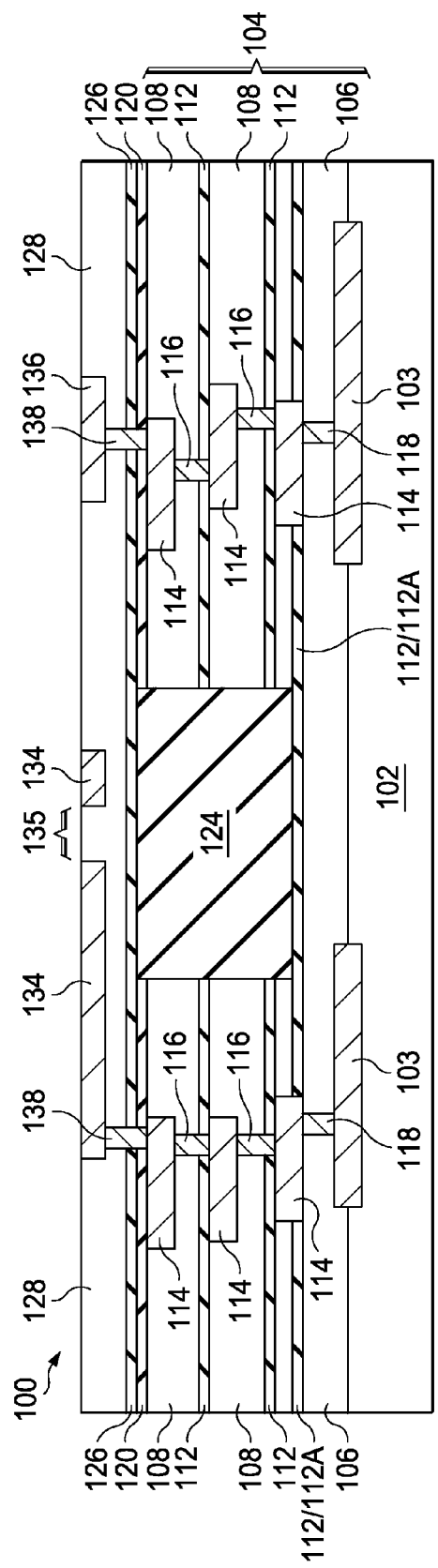

FIGS. 4 through 6 illustrate the formation of a metal pad and a metal line(s). The respective step is shown as step 304 in the process flow shown in FIG. 18. Referring to FIG. 4, dielectric layer 126 is formed. Dielectric layer 126 may be a homogeneous layer or a composite layer. In accordance some exemplary embodiments, dielectric layer 126 includes an oxide layer (silicon oxide, for example) and a nitride layer (silicon nitride, for example) over the oxide layer. In other embodiments, dielectric layer 126 includes either the oxide layer or the nitride layer, but not both. The formation of dielectric layer 126 may be performed through PECVD in some embodiments. Dielectric layer 128 is then formed over dielectric layer 126. In some embodiments, dielectric layer 128 comprises Un-doped Silicate Glass (USG). Other dielectric materials may also be used.

Next, referring to FIG. 5, trenches 130 and via opening 132 are formed. Trenches 130 are in dielectric layer 128, and via openings 132 may extend from dielectric layer 128 into dielectric layers 126 and 120. Metal lines 114 are exposed through via openings 132. Trenches 130 and via openings 132 may be formed using, for example, photolithography techniques, which involve depositing a photo resist material (not shown), which is subsequently irradiated (exposed) and developed to remove a portion of the photoresist material corresponding to trenches 130 or via openings 132. The remaining photo resist material protects the underlying material from subsequent processing steps, such as etching.

The formation of trenches 130 and via openings 132 may be achieved using any suitable etching process, such as a dry etch, an anisotropic wet etch, or any other suitable anisotropic etch or patterning process.

Figure 16:
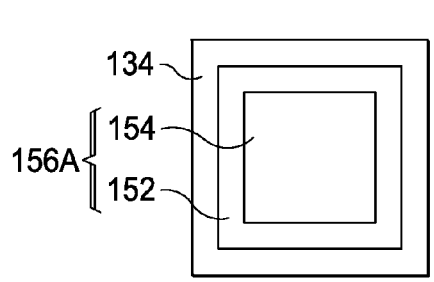
FIG. 16 illustrates a bottom view of a conductive plug and the encircling metal pad.

Next, as shown in FIG. 6, trenches 130 and via openings 132 are filled with conductive materials to form metal pad 134, metal line 136, and vias 138. Vias 138 electrically connect metal pad 134 and metal line 136 to the underlying metal lines 114. Furthermore, metal pad 134 forms a ring shape, as shown in FIG. 16, wherein the ring of metal pad 134 encircles opening 135 (FIG. 6), in which a portion of dielectric layer 128 is located. In some embodiments, metal pad 134, metal line 136, and vias 138 include a conductive barrier layer (not illustrated separately) and a filling metal (not illustrated separately) over the conductive barrier layer. For example, the conductive barrier layer may be formed of titanium, titanium nitride, tantalum, tantalum nitride, or other alternatives. The material of the filling metal may include copper, a copper alloy, silver, gold, tungsten, aluminum, or alloys thereof. In some embodiments, the formation of metal pad 134, metal line 136, and vias 138 includes depositing the conductive barrier and then a thin seed layer of copper or copper alloy (not shown), and filling the trenches 130 and via opening 132 through, for example, electro-plating, electro-less plating, deposition, or the like. A CMP may be performed to level the surface of metal pad 134, metal line 136 to remove excess material from the top surface of dielectric layer 128.

Metal line 136 may be used to electrically inter-couple the features in wafer 100, and hence the metal layer including metal pad 134 and metal line 136 can be used as an extra routing layer of wafer 100.

Figure 7:
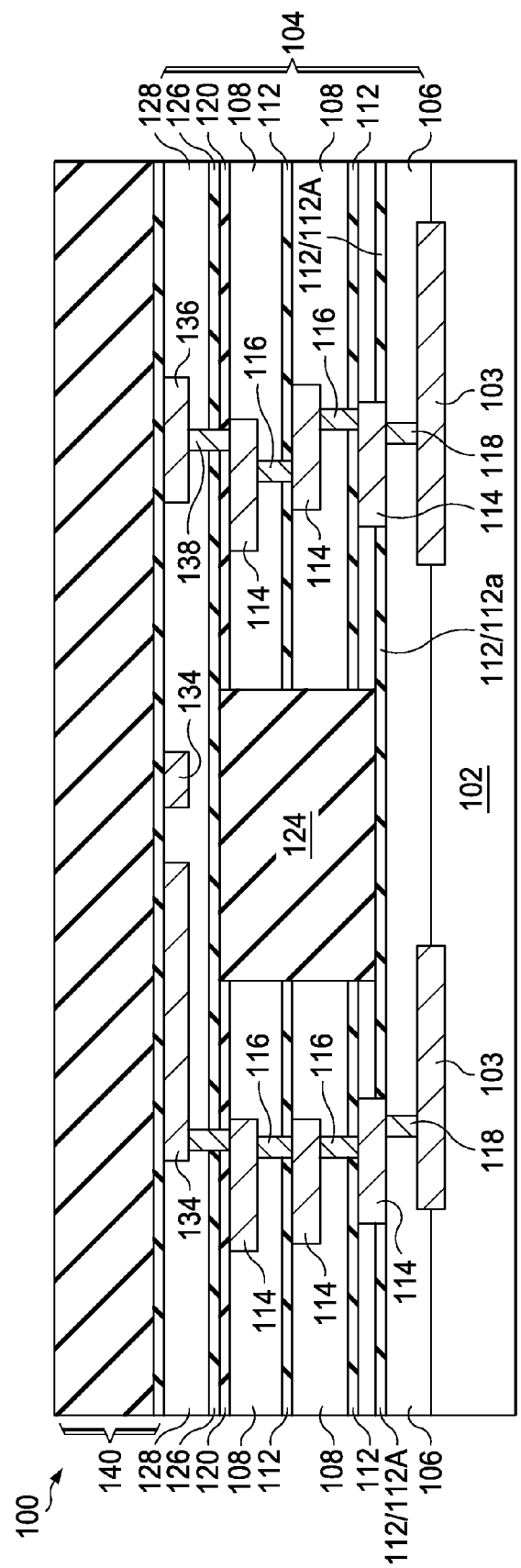

FIG. 7 illustrates the formation of an additional dielectric layer(s) 140 over metal pad 134 and metal line 136. The respective step is shown as step 306 in the process flow shown in FIG. 18. In accordance with some embodiments, dielectric layer 140 comprises a silicon containing dielectric layer such as silicon oxide, silicon nitride, silicon oxynitride, or the like, which is suitable for fusion bonding.

Figure 8:
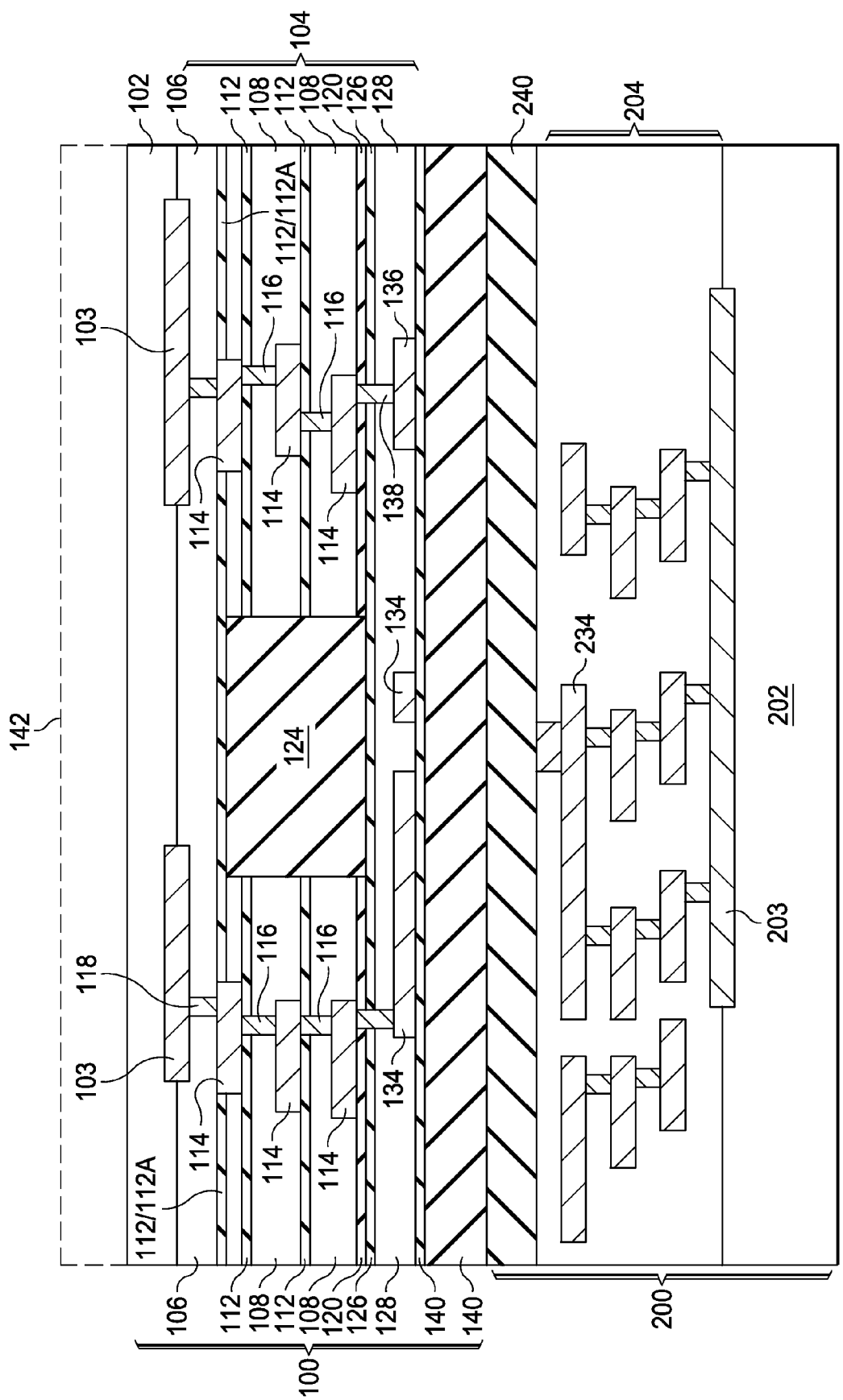
FIGS. 8 through 15 illustrate the cross-sectional views of intermediate stages in the formation of a package including two chips and a conductive plug interconnecting two chips in accordance with some other embodiments.

FIGS. 8 through 15 illustrate the cross-sectional views of intermediate stages in the bonding of wafer 100 to wafer 200, and the formation of through-vias interconnecting wafer 100 and 200. FIG. 8 illustrates the bonding of wafers 100 and 200. The respective step is shown as step 308 in the process flow shown in FIG. 18. Semiconductor wafer 200 may also include circuits 203, which may have any of the devices as discussed for circuits 103. The semiconductor wafer 100 and the second semiconductor wafer 200 are bonded together through suitable bonding techniques such as oxide-to-oxide bonding, for example. In accordance with some embodiments, in the oxide-to-oxide bonding process, the surface layers of semiconductor wafers 100 and 200 are oxide layers (for example, silicon oxide), which are bonded to each other through fusion bonding. Wafer 200 may be an Application Specific Integrated Circuit (ASIC) wafer. In some exemplary embodiments, wafer 200 includes the circuits that is configured to process the signals generated in wafer 100, which is an image sensor wafer in some exemplary embodiments.

Wafer 200 also includes surface dielectric layer 240, which may also include a silicon containing dielectric material in accordance with some embodiments. The bonding of wafers 100 and 200 is through the bonding of dielectric layers 140 and 240. After the bonding of wafers 100 and 200, metal pad 234 in wafer 200 is aligned to dielectric region 124 and metal pad 134 in wafer 100.

After the bonding of wafers 100 and 200, a backside grinding is performed to thin semiconductor substrate 102. The respective step is shown as step 310 in the process flow shown in FIG. 18. The resulting semiconductor substrate 102 may have a thickness smaller than about 10 μm. The thickness of the thinned semiconductor substrate 102 may also be in the range between about 3 μm and about 5 μm in some embodiments. Dashed line 142 represents the back surface of semiconductor substrate 102 before the backside grinding is performed.

Figure 9:
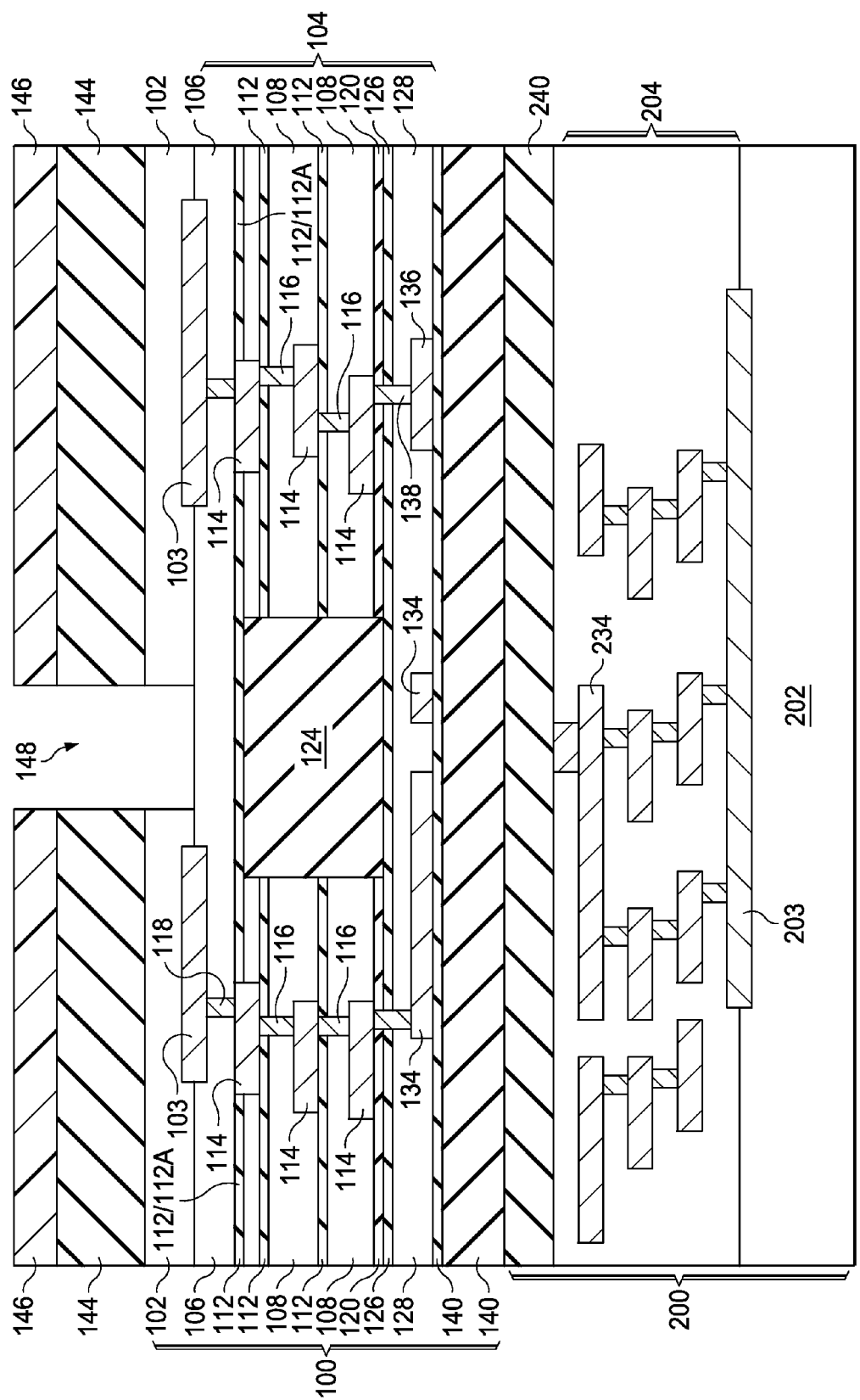

FIGS. 9 through 12 illustrate the formation of an opening penetrating through wafer 100 and extending into wafer 200. The respective step is shown as step 312 in the process flow shown in FIG. 18. Referring to FIG. 9, dielectric hard mask layer 144 is formed on the back surface of semiconductor substrate 102. In accordance with some exemplary embodiments, dielectric hard mask layer 144 comprises an oxide such as silicon oxide. In alternative embodiments, other dielectric materials such as silicon nitride, silicon carbide, and the like, may be used. The thickness of dielectric hard mask layer 144 may be in the range between about 20 kÅ and about 100 kÅ. Photo resist 146 is formed over dielectric hard mask layer 144, and is patterned. Dielectric hard mask layer 144 is then etched using the patterned photo resist 146 as an etching mask. The etching is performed until semiconductor substrate 102 is exposed. Opening 148 is hence formed as a result of the etching. The etching is performed through dry etching, which is anisotropic. Hence, the sidewalls of opening 148 are substantially vertical. Photo resist 146 is then removed.

Figure 10:
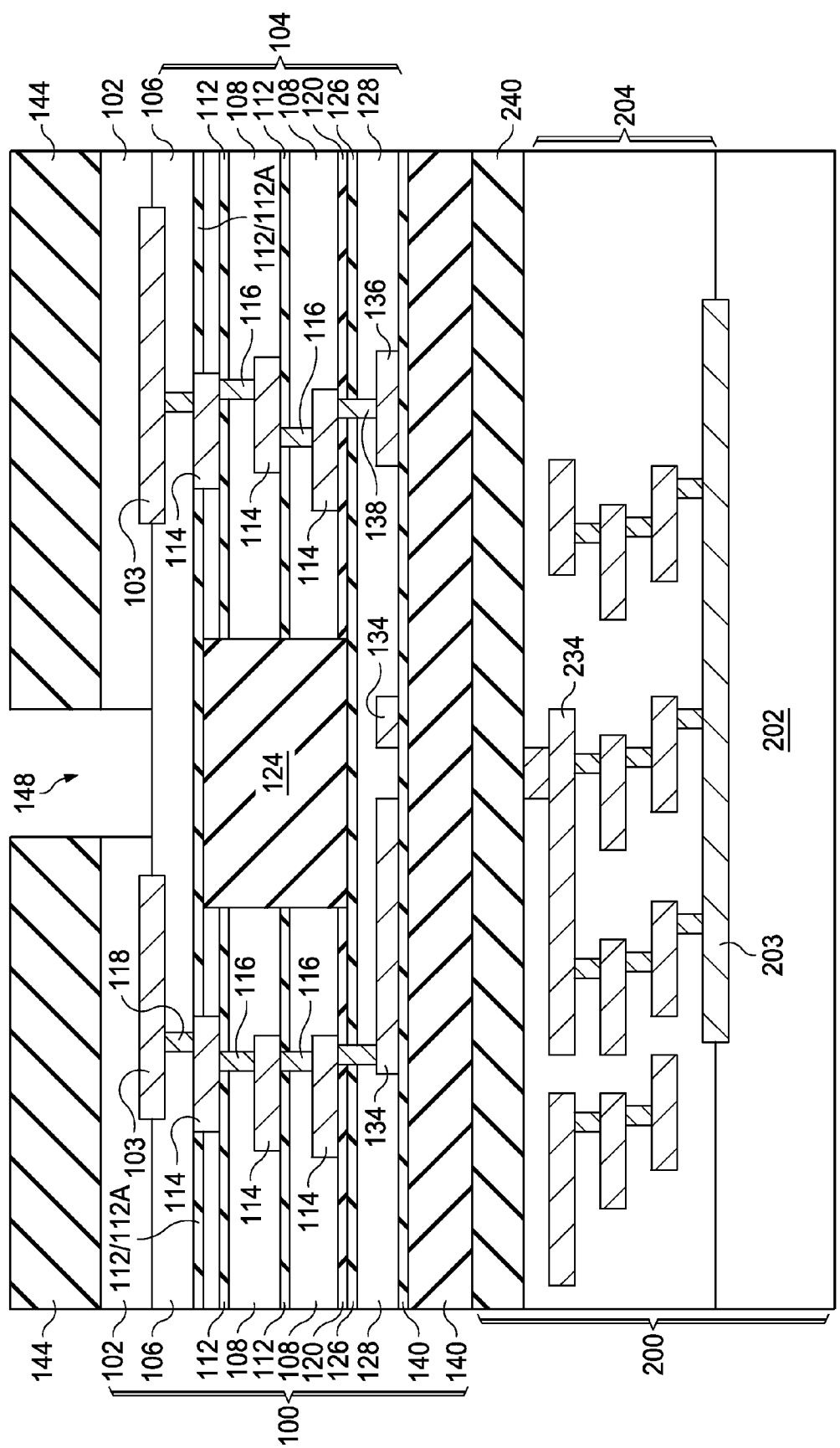

FIG. 10 illustrates the etching of semiconductor substrate 102. Dielectric hard mask layer 144 is used as an etching mask, so that opening 148 extends downwardly to penetrate through semiconductor substrate 102. The etching may stop on the ILD 106 or the contact etch stop layer (not shown) in wafer 100. The etching may be performed through dry etching, which is anisotropic. Hence, the sidewalls of opening 148 remain to be substantially vertical.

Figure 11:
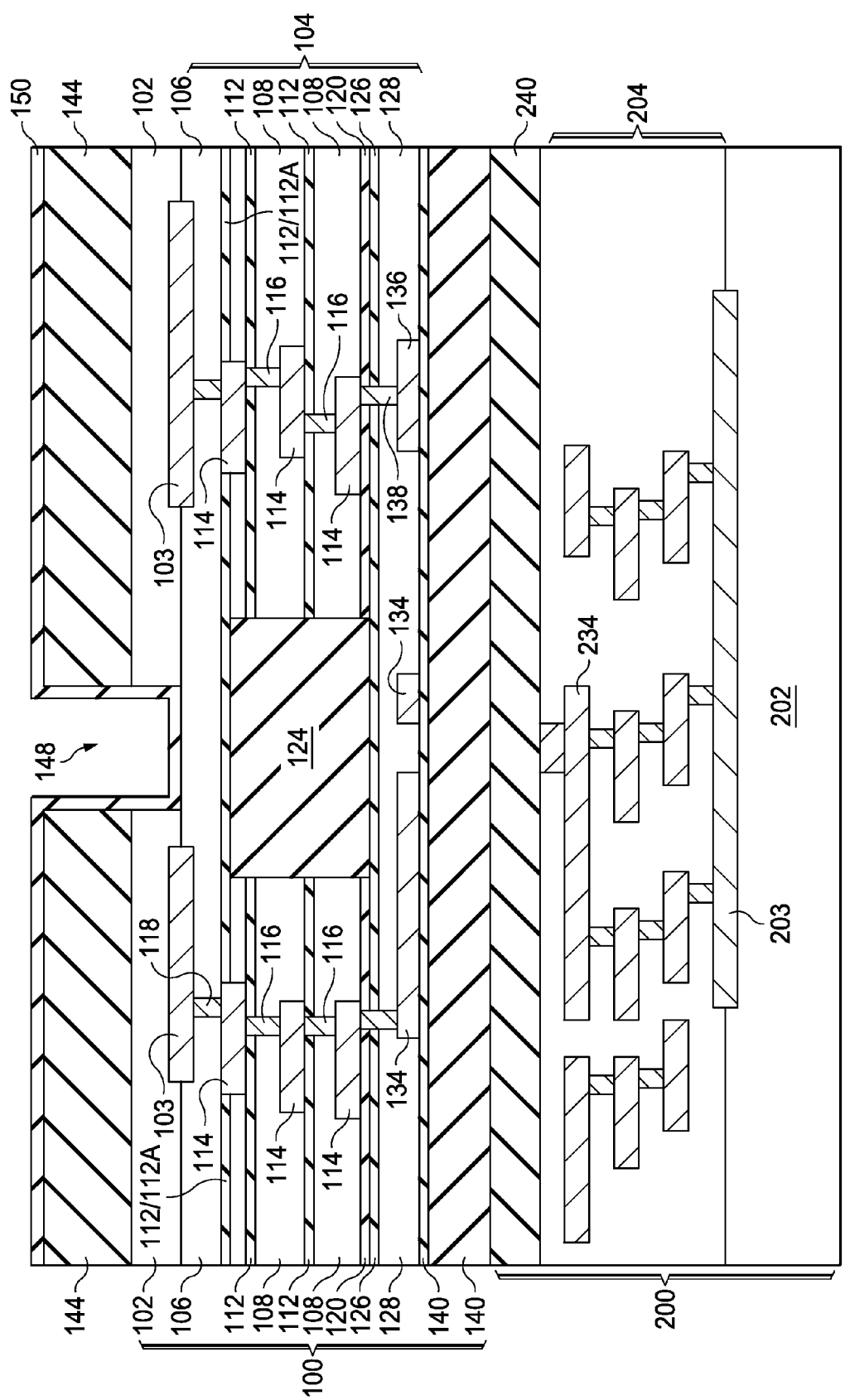

FIG. 11 illustrates the formation of insulation layer 150, which is formed on the surface of dielectric hard mask layer 144. Insulation layer 150 further extends into opening 148. Insulation layer 150 is formed as a conformal layer, wherein the thickness of the vertical portions of insulation layer 150 is close to the thickness of the horizontal portions of insulation layer 150. Accordingly, the sidewalls of semiconductor substrate 102 exposed to opening 148 is fully covered by insulation layer 150. Insulation layer 150 is formed of a dielectric material, which may be silicon oxide, silicon nitride, silicon oxynitride, silicon carbide, or the like. In accordance with some embodiments, insulation layer 150 is formed using a suitable technique such as a CVD method or ALD. The thickness of insulation layer 150 may be in the range between about 1 kÅ to about 3 kÅ.

Figure 12:
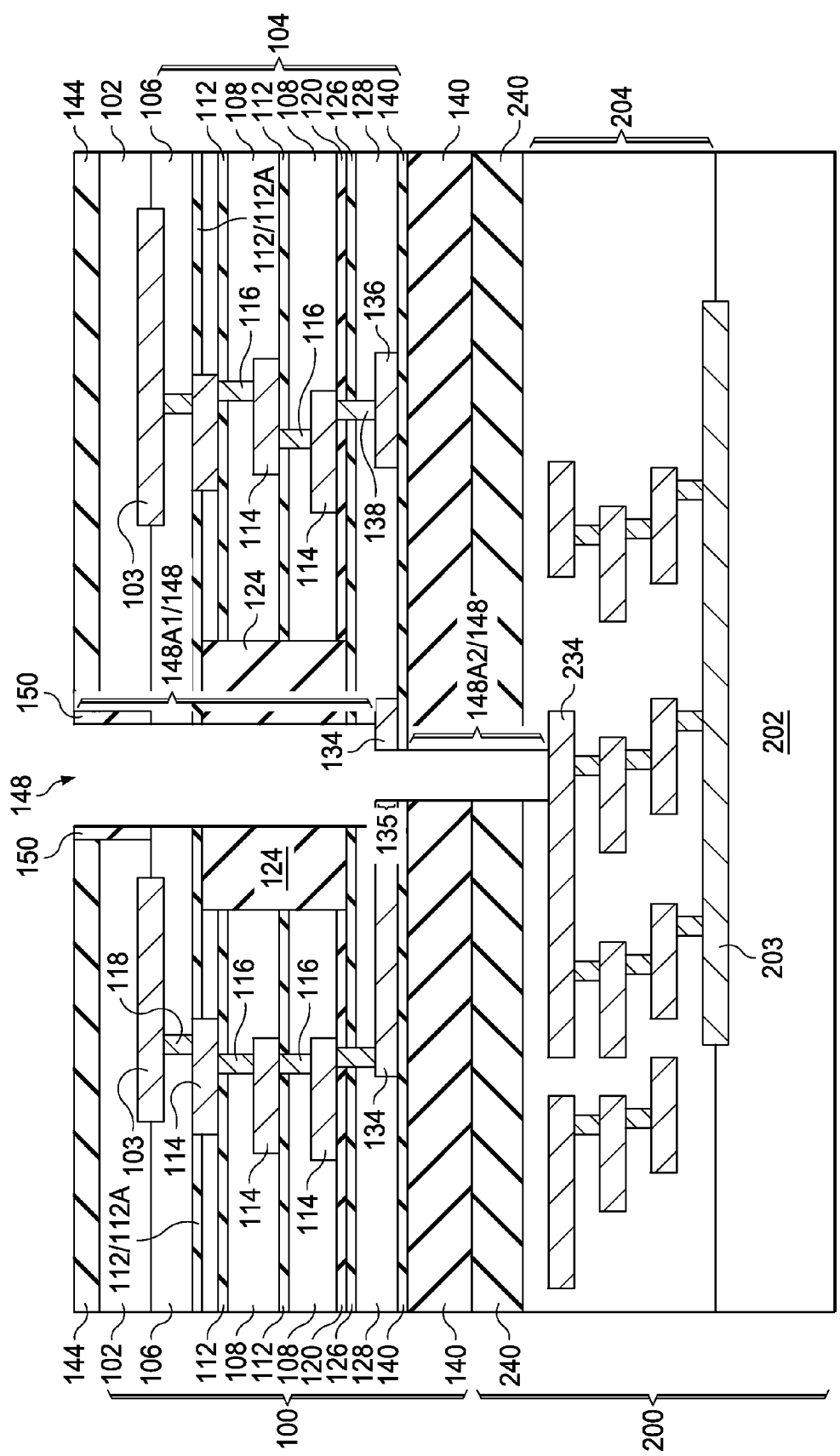

Referring to FIG. 12, an etching step is performed to further extend opening 148 downwardly, until opening 148 penetrates through wafer 100 and extend into wafer 200. In accordance with some embodiments, the etching step is performed through a blanket etching, wherein no additional etching mask or photo resist is formed over insulation layer 150. The etching includes an anisotropic etching. Accordingly, the horizontal portions of insulation layer 150 are first etched. Next, dielectric hard mask layer 144, which is exposed after the removal of the horizontal portions of insulation layer 150, is etched and thinned. In the meantime, the dielectric layers underlying and exposed to opening 148 are etched. The etched dielectric layers may include 106, 112, 124, 120, 126, 128, 140, and 240. Opening 148 eventually penetrates through wafer 100 and extend into wafer 200.

The formation of opening 148 experiences two etching stages. In the first etching stage, the portions of dielectric layers over metal pad 134 are etched to finish the formation of opening portion 148A1. The first etching stage concludes when metal pad 134 is exposed. The etchant gas is selected to have a very low etching rate for etching metal pad 134. Accordingly, metal pad 134 functions as a metal hard mask to stop the first etching stage. Although the etching rate is low, metal pad 134 may still be partially etched away, thereby forming a recess (not shown) in the exposed portion of metal pad 134. The depth of the recess, if any, is controlled to be as small as possible.

In the second etching stage, the etching continues through the opening 135 encircled by metal pad 134, and the portions of dielectric layers 140 and 240 aligned to the opening 135 in metal pad 134 are etched. Opening portion 148A2 is thus formed to extend from wafer 100 into wafer 200. The etching is finished when metal pad 234 is exposed, which acts as the etch stop layer of the second etching stage. Dielectric hard mask layer 144 may have a bottom layer left after the etching. In alternative embodiments, instead of the blanket etching, a photo resist (not shown) is formed as the etching mask to define the pattern of opening 148.

Figure 13:
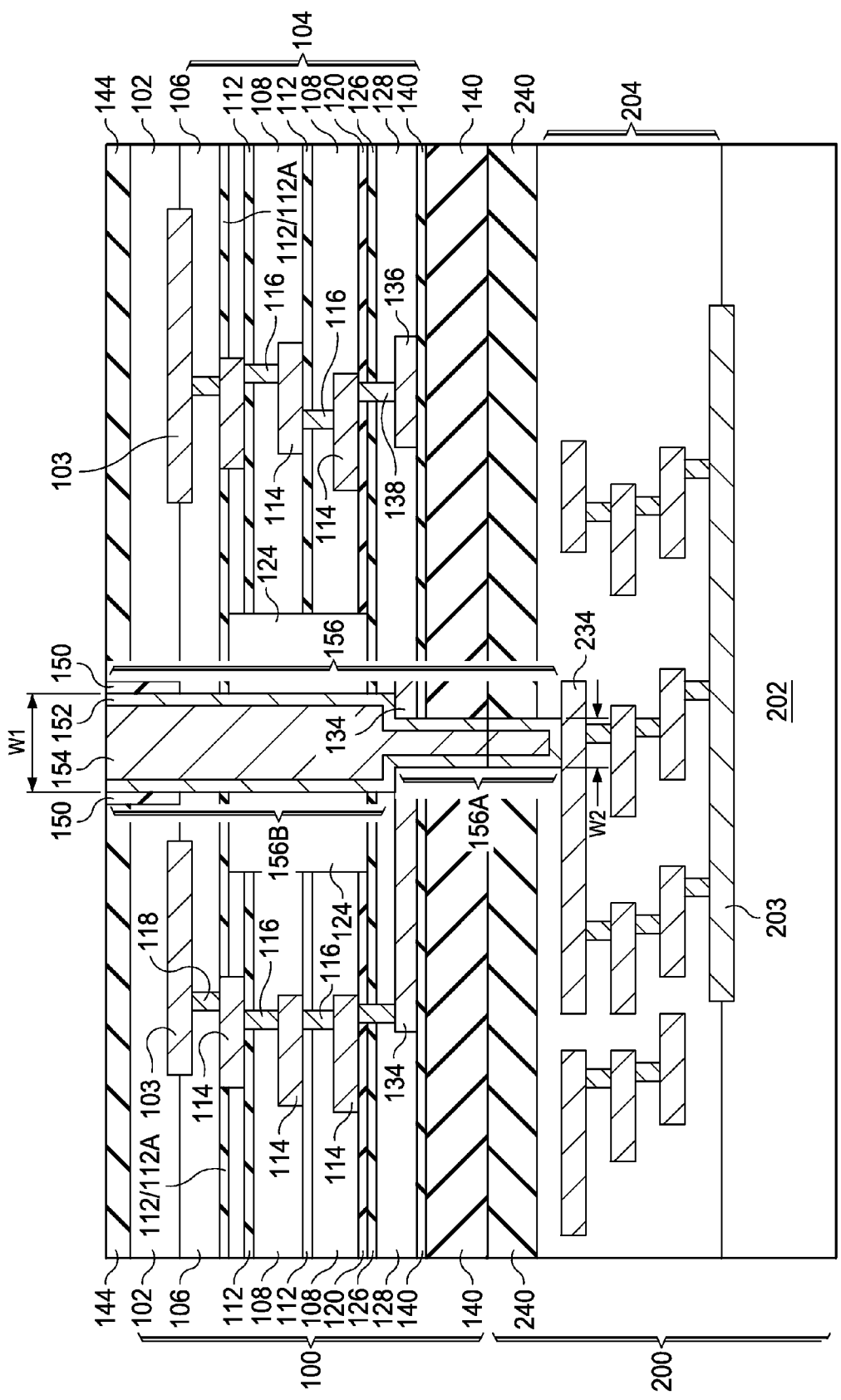

FIG. 13 illustrates a cross-sectional view after conductive materials have been filled in opening 148 (FIG. 12) in accordance with various embodiments of the present disclosure. The respective step is shown as step 314 in the process flow shown in FIG. 18. As a result, conductive plug 156 is formed. Conductive plug 156 is alternatively referred to as through-via hereinafter since it penetrates through wafer 100. In some embodiments, the formation of conductive plug 156 includes forming a conformal conductive barrier layer 152. Conductive barrier layer 152 may be formed from titanium, titanium nitride, tantalum, tantalum nitride, or combinations thereof. In some embodiments, conductive barrier layer 152 is a conformal layer with a substantially uniform thickness, which may be formed using suitable fabrication techniques such as ALD.

In addition, a seed layer (not shown) may be deposited over the conductive barrier layer 152. The seed layer may be formed from copper, nickel, gold, any combination thereof and/or the like. The seed layer may be formed through suitable deposition techniques such as PVD, CVD, and/or the like.

Once barrier layer 152 and the seed layer have been deposited in opening 148 (FIG. 12), metallic material 154 is deposited to fill the rest of opening 148. The metallic material may include tungsten, titanium, aluminum, copper, or alloys thereof. In some embodiments, the metallic material is filled in through an electroplating process. After the filling of the metallic material, a planarization such as CMP is performed to remove the excess portions of the metallic material. Metallic material 154 (and the conductive barrier layer 152) continuously extends from the top surface of semiconductor substrate 102 into dielectric layer(s) 240, with no interface formed therein since each of conductive barrier layer 152 and metallic material 154, which is formed of a homogeneous material, is formed in a single deposition step.

As also shown in FIG. 13, conductive plug 156 comprises two portions. The first portion 156A extends from metal pad 234 to metal pad 134, and has width W2. The first portion 156A physically contacts the inner sidewalls of the respective metal pad 134. The second portion 156B extends from metal pad 134 to the top surface of dielectric hard mask layer 144. The second portion 156B has width W1, which is smaller than width W2. The two portions of conductive plug 156 in combination form a continuous via that penetrates through wafer 100, wherein no interface is formed between the two portions.

In the structure shown in FIG. 13, conductive plug 156 electrically couples metal pad 134 in wafer 100 to metal pad 234 in wafer 200. Metal pads 134 and 234 may be electrically connected to electrical circuits 103 and 203, respectively. Hence, conductive plug 156 is used as an electrical connection for electrically coupling the features in wafers 100 and 200.

Figure 14:
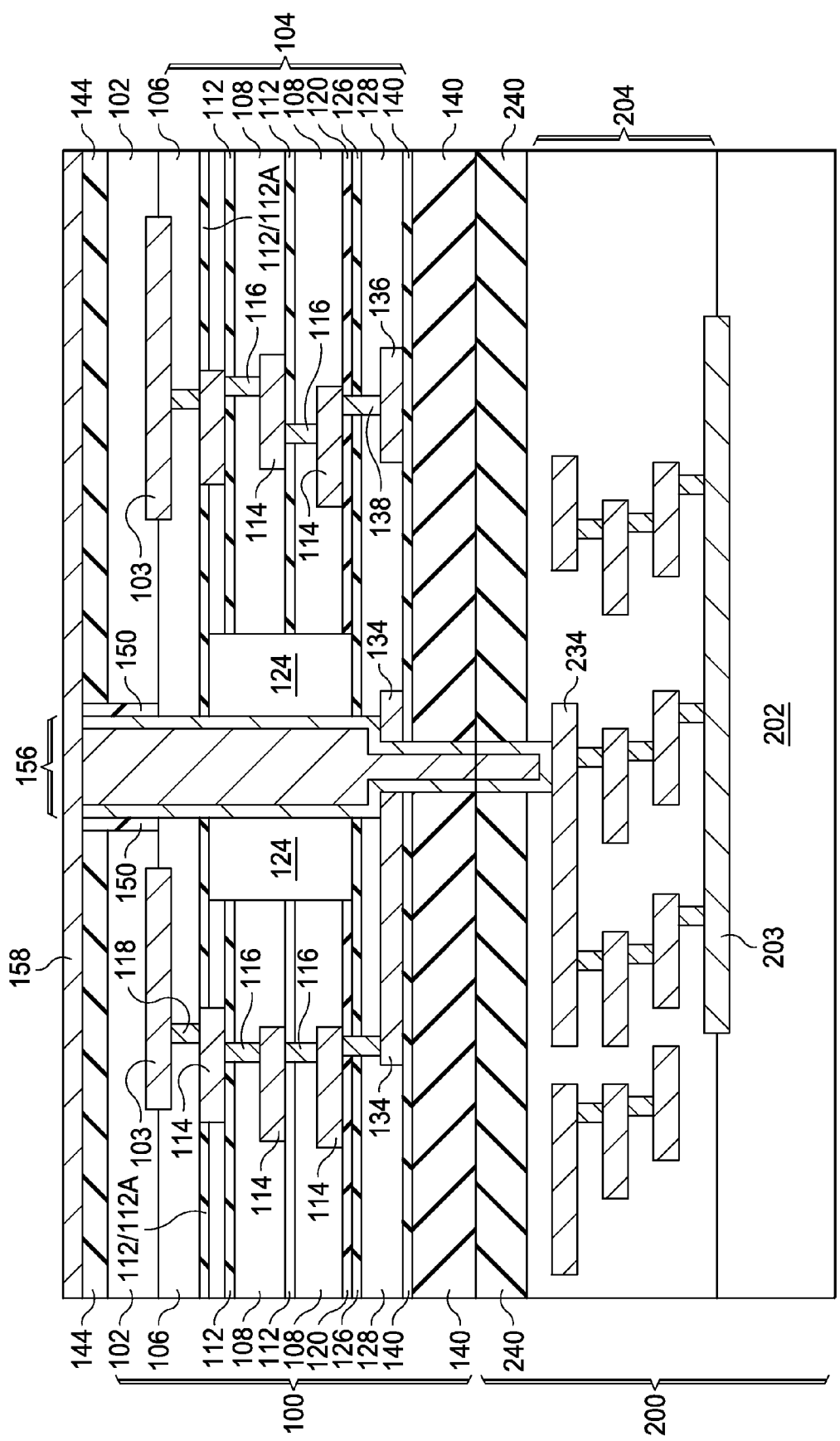

FIG. 14 illustrates the formation of dielectric layer 158 in accordance with various embodiments of the present disclosure. The respective step is shown as step 316 in the process flow shown in FIG. 18. Dielectric layer 158 may comprise dielectric materials such as silicon nitride, silicon oxynitride, silicon oxycarbide, silicon carbide, combinations thereof, and/or multi-layers thereof. Dielectric layer 158 may be deposited over the semiconductor device through suitable deposition techniques such as a CVD method.

Figure 15:
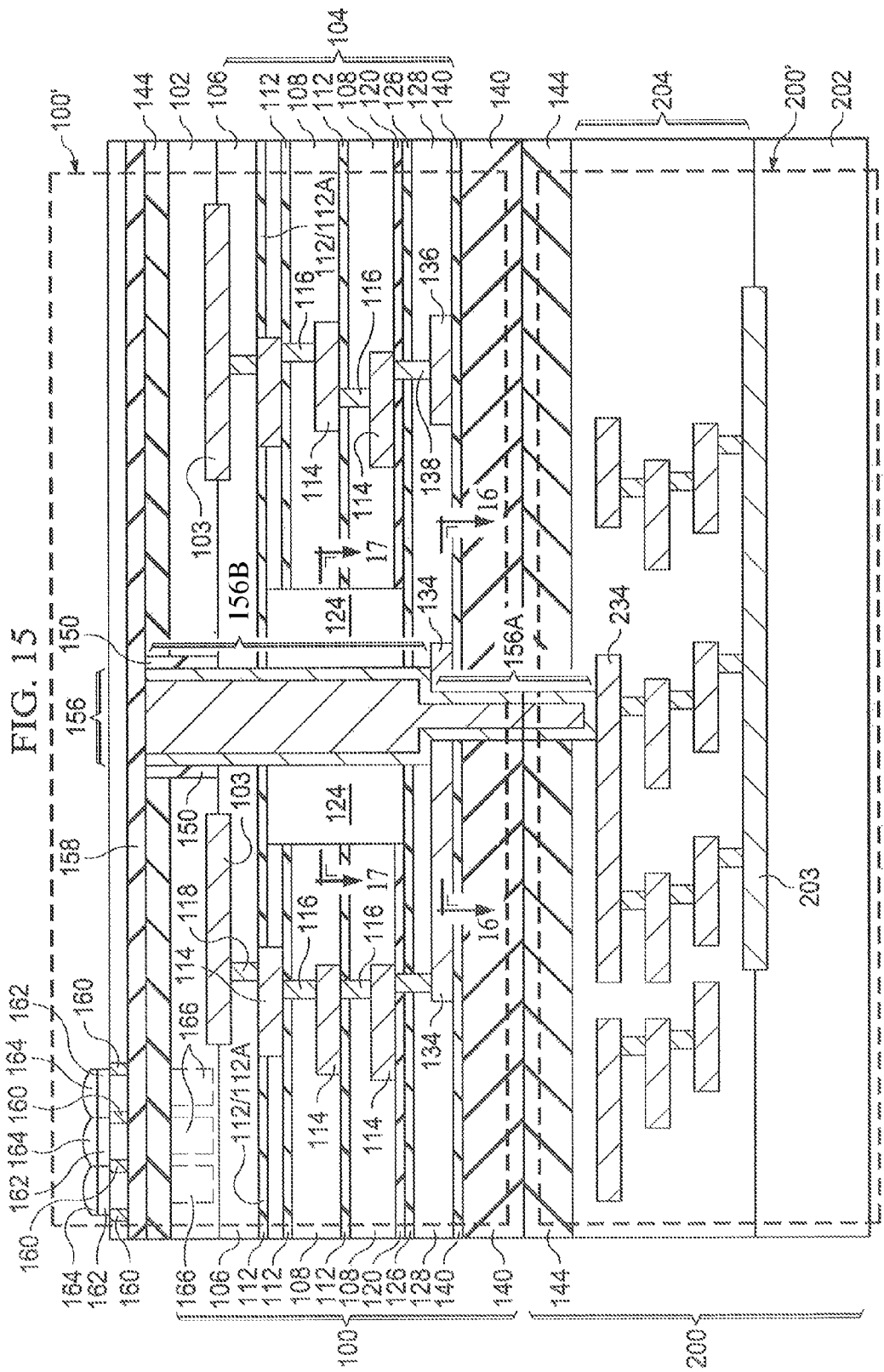

In some embodiments of the present disclosure, wafer 100 is a Backside Illumination (BSI) chip. Accordingly, after the formation of dielectric layer 158, a plurality of features is formed over dielectric layer 158, as shown in FIG. 15. For example, FIG. 15 schematically illustrates metal grid 160 formed over dielectric layer 158, wherein the openings in metal grid 160 are aligned to photo diodes 166 in semiconductor substrate 102. Metal grid 160 may comprise tungsten, aluminum, chromium, or the like. Color filter 162 and micro lenses 164 are formed over metal grid 160, and are aligned to the respective underlying photo diodes 166.

In subsequent steps, the bonded wafers 110 and 210 are sawed into a plurality of packages, with each of the packages including chip 100' from wafer 100 and chip 200' from wafer 200.

In alternative embodiments, in the packages that are sawed from the bonded wafers 100 and 200, dielectric layer 158 is a top layer, and no metal grid, color filters, and micro lenses are formed over dielectric layer 158.

In the structure shown in FIGS. 14 and 15, dielectric region 124 forms a homogenous region that extend into a plurality of dielectric layers, which are formed of different materials and hence have different etching characteristics. For example, in the etching for forming opening 148, as shown in FIG. 12, if dielectric region 124 is not formed, opening 148 would have to penetrate through a plurality of dielectric layers such as 108 and 112. These layer response differently to the etchant. For example, the lateral etching distances of these layers are different from each other. As a result, the sidewalls of opening 148 will be very rough with a plurality of recesses and protrusions in different layers. This results in the resulting conductive plug 156 (FIGS. 14 and 15) to have a rough surface. The resistivity of conductive plug 156 is thus not stable, and may vary from one conductive plug to another. This results in the circuit performance variation. As a comparison, in the embodiments of the present disclosure, by forming the dielectric region 124 (FIGS. 14 and 15) that is formed of a homogenous material, the different portions of dielectric region 124 respond uniformly to the etchant used for etching dielectric region 124, and hence the sidewalls of dielectric region 124 are smooth. The variation in the performance of the resulting conductive plug is thus eliminated.

FIG. 16 illustrates a bottom view of metal pad 134 and conductive plug portion 156A, wherein the top view is obtained from the plane crossing line 16-16 in FIG. 15. As shown in FIG. 16, metal pad 134 forms a ring encircling conductive plug portion 156A, which occupies the opening in the ring. It is appreciated that although FIG. 16 illustrates that the perimeter of metal pad 134 and conductive plug portion 156A have rectangular top-view shapes, they can be any shapes including circles, hexagons, octagons, ellipses, or the like.

Figure 17:
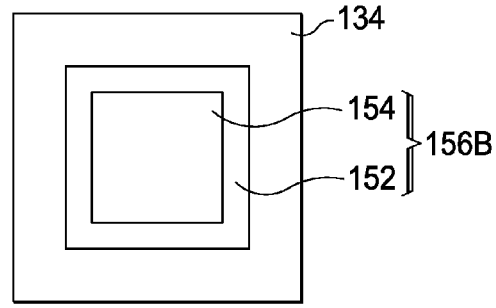
FIG. 17 illustrates a bottom view of a conductive plug and the encircling dielectric region.

FIG. 17 illustrates a bottom view of dielectric region 124 and conductive plug 156, wherein the top view is obtained from the plane crossing line 17-17 in FIG. 15. As shown in FIG. 17, dielectric region 124 forms a ring encircling conductive plug portion 156B, which occupies the opening in the ring. It is appreciated that although FIG. 17 illustrates that the perimeter of metal pad 134 and conductive plug portion 156B have rectangular top-view shapes, they can have any shapes including circles, hexagons, octagons, ellipses, or the like.

The embodiments of the present disclosure have some advantageous features. By adopting the embodiments of the present disclosure, the semiconductor substrate of a wafer can be thinned before forming the through-via that interconnects two wafers. Accordingly, with the semiconductor substrate having a small thickness, the pitch's and the sizes of the through-vias (conductive plugs) can be reduced. The formation of the homogenous dielectric region further improves the reliability of the performance of the through-via.

In accordance with some embodiments of the present disclosure, a package includes a semiconductor chip. The semiconductor chip includes a substrate, a plurality of dielectric layers underlying the substrate, a dielectric region penetrating through the plurality of dielectric layers, and a metal pad overlapped by the dielectric region. A conductive plug penetrates through the substrate, the dielectric region, and the metal pad.

In accordance with alternative embodiments of the present disclosure, a package includes a first and a second semiconductor chip. The first semiconductor chip includes a first substrate, a first plurality of dielectric layers, and a homogenous dielectric region in the first plurality of dielectric layers. The second semiconductor chip includes a second substrate, a second plurality of dielectric layers over the second substrate, wherein the first plurality of dielectric layers is bonded to the second plurality of dielectric layers, and a metal pad in one of the second plurality of dielectric layers. A conductive plug penetrates through the first substrate and the homogenous dielectric region, and extends to the metal pad.

In accordance with yet alternative embodiments of the present disclosure, a method includes forming a dielectric region penetrating through a plurality of dielectric layers in a first wafer, forming a first metal pad aligned to the dielectric region, with the first metal pad including a first opening, and bonding the first wafer to a second wafer. The first wafer is etched to form a second opening penetrating through the first wafer and extending into a second wafer. The second opening penetrates through the dielectric region and the first opening in the first metal pad. A second metal pad in the second wafer is exposed through the second opening. The second opening is filled with a conductive material to form a conductive plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first semiconductor chip including:
  a first substrate;
  a first plurality of dielectric layers underlying the first substrate;
  a dielectric region penetrating through the first plurality of dielectric layers; and
  a first metal pad overlapped by the dielectric region; and
a conductive plug penetrating through the first substrate, the dielectric region, and the first metal pad, wherein an entirety of the dielectric region is underlying the first substrate.

2. The package of claim 1, wherein the dielectric region penetrates through all Inter-Metal Dielectric (IMD) layers of the first semiconductor chip, and wherein the all IMD layers comprise the first plurality of dielectric layers.

3. The package of claim 1, wherein the dielectric region forms a ring encircling the conductive plug.

4. The package of claim 1, wherein the dielectric region is formed of a homogenous dielectric material.

5. The package of claim 1 further comprising:
a second semiconductor chip underlying the first semiconductor chip, the second semiconductor chip comprising:
  a second substrate;
  a second plurality of dielectric layers over the second substrate, wherein one of the first plurality of dielectric layers is bonded to one of the second plurality of dielectric layers; and
  a second metal pad in one of the second plurality of dielectric layers, wherein the conductive plug extends into the second semiconductor chip to contact a top surface of the second metal pad.

6. The package of claim 1, wherein conductive plug comprises:
a first portion on a first side of the first metal pad, wherein the first portion has a first width; and
a second portion with a portion in the first metal pad and an additional portion on a second side of the first metal pad, wherein the second portion has a second width smaller than the first width.

7. The package of claim 1, wherein the dielectric region comprises a first surface and a second surface opposite to the first surface, with the first surface and the second surface being opposite surfaces parallel to a major surface of the first substrate, and the first surface and the second surface are both underlying the first substrate.

8. A package comprising:
a first semiconductor chip comprising:
  a first substrate;
  a first plurality of dielectric layers; and
  a homogenous dielectric region in the first plurality of dielectric layers;
a second semiconductor chip comprising:
  a second substrate;
  a second plurality of dielectric layers over the second substrate, wherein the first plurality of dielectric layers is bonded to the second plurality of dielectric layers; and
  a metal pad in one of the second plurality of dielectric layers; and
a conductive plug penetrating through the first substrate and the homogenous dielectric region, and extends to the metal pad.

9. The package of claim 8 further comprising an additional metal pad in the first semiconductor chip, wherein the conductive plug penetrates through the additional metal pad, and stops on a top surface of the metal pad.

10. The package of claim 9, wherein the additional metal pad is located between the homogenous dielectric region and the metal pad in the second semiconductor chip.

11. The package of claim 9, wherein the additional metal pad fully encircles the conductive plug.

12. The package of claim 8, wherein the homogenous dielectric region fully encircles the conductive plug.

13. The package of claim 8, wherein one of the first plurality of dielectric layers is in physical contact with, and physically bonded to, one of the second plurality of dielectric layers.

14. A method comprising:
forming a dielectric region penetrating through a plurality of dielectric layers in a first wafer;
forming a first metal pad aligned to the dielectric region, with the first metal pad comprising a first opening;
bonding the first wafer to a second wafer;
etching the first wafer that has the first opening in the first metal pad to form a second opening penetrating through the first wafer and extending into the second wafer, wherein the second opening penetrates through the dielectric region and the first opening in the first metal pad, and wherein a second metal pad in the second wafer is exposed through the second opening; and
filling the second opening with a conductive material to form a conductive plug.

15. The method of claim 14, wherein the forming the dielectric region comprises:
etching the plurality of dielectric layers to form a third opening; and
filling the third opening with a homogenous dielectric material.

16. The method of claim 15, wherein after the etching the plurality of dielectric layers, an Inter-Layer Dielectric (ILD) is exposed to the third opening.

17. The method of claim 16, wherein after the etching the plurality of dielectric layers, a dielectric layer contacting an Inter-Layer Dielectric (ILD) is exposed to the third opening.

18. The method of claim 14, wherein in the etching the first wafer, the first metal pad acts as an etching mask during the etching for forming a lower portion of the second opening.

19. The method of claim 14 further comprising, after the bonding and before the etching the first wafer to form the second opening, thinning a semiconductor substrate of the first wafer.

20. The method of claim 14, wherein the forming the dielectric region is performed after all low-k dielectric layers in the first wafer are formed.

* * * * *